(12) United States Patent
Lim (10) Patent No.: US 8,076,702 B2
(45) Date of Patent: Dec. 13, 2011

(54) CMOS IMAGE SENSOR AND FABRICATING METHOD THEREOF

(75) Inventor: Keun-Hyuk Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 408 days.

(21) Appl. No.: 11/963,407

(22) Filed: Dec. 21, 2007

(65) Prior Publication Data

US 2008/0210990 A1 Sep. 4, 2008

(30) Foreign Application Priority Data

Dec. 29, 2006 (KR) .................. 10-2006-0137357

(51) Int. Cl.
*H01L 27/06* (2006.01)
*H01L 21/336* (2006.01)

(52) U.S. Cl. ........ 257/288; 257/290; 257/291; 257/292; 257/E25.032; 257/E27.122; 257/E27.133

(58) Field of Classification Search .................. 257/213, 257/288, 290, 291, 292, 21, 182, E25.032, 257/E27.122, E27.133
See application file for complete search history.

(56) References Cited

U.S. PATENT DOCUMENTS

| 6,403,998 B1 * | 6/2002 | Inoue | 257/292 |
|---|---|---|---|
| 2003/0138985 A1 * | 7/2003 | Rhodes | 438/48 |
| 2006/0124969 A1 * | 6/2006 | Byun | 257/216 |

FOREIGN PATENT DOCUMENTS

| KR | 10-2006-0077117 A | 7/2006 |
|---|---|---|
| KR | 10-0654050 B1 | 11/2006 |

\* cited by examiner

*Primary Examiner* — A. Sefer
*Assistant Examiner* — Ermias Woldegeorgis
(74) *Attorney, Agent, or Firm* — Sherr & Vaughn, PLLC (57) ABSTRACT

A CMOS image sensor and fabricating method thereof by which capacitance of a floating diffusion region (FD) can be increased. The CMOS image sensor can include an epitaxial layer formed over a semiconductor substrate; a gate electrode formed over the epitaxial layer; a gate metal formed over a floating diffusion region of the epitaxial layer; n+ type source and drain regions formed in the epitaxial layer; a gate spacer formed on both sidewalls of the gate electrode and both sidewalls of the gate metal; an insulating interlayer formed over the epitaxial layer including the gate electrode, the gate spacer and the gate metal layer, the insulating interlayer including a first contact hole extending through the insulating interlayer exposing the source region; a second contact hole extending through the insulating interlayer exposing the gate metal; a first contact plug formed in the first contact hole and connected to the source region; a second contact plug formed in the second contact hole and connected to the gate metal; and a metal line formed over the first contact plug and the second contact plug to electrically connect the source region to the gate metal.

10 Claims, 10 Drawing Sheets

FIG. 8G

CMOS IMAGE SENSOR AND FABRICATING METHOD THEREOF

The present application claims priority under 35 U.S.C. 119 to Korean Patent Application No. 10-2006-0137357 (filed on Dec. 29, 2006), which is hereby incorporated by reference in its entirety.

BACKGROUND

An image sensor is a device for converting an optical image to an electric signal. Image sensors may be categorized generally as complementary metal-oxide-silicon image sensors (CMOS) and charge coupled device CCS image sensors.

Comparatively, CCD image sensors may exhibit enhanced photosensitivity and lower noise than CMOS image sensors but has difficulty achieving high integration density and low power consumption. On the contrary, CMOS image sensors has simple manufacturing processes and may be more suitable for achieving high integration density and low power consumption.

Aspects of semiconductor device fabricating technology have focused on developing CMOS image sensors due to improved fabricating technology and characteristics of CMOS image sensors. Each pixel of a CMOS image sensor may include a plurality of photodiodes for receiving light and a plurality of transistors for controlling inputted video signals.

CMOS image sensors may be categorized in accordance with the number of transistors, such as a 3T-type, a 4T-type, etc. A 3T-type CMOS image sensor may include a photodiode and three transistors while a 4T-type image sensor may include a photodiode and four transistors.

Figure 1:
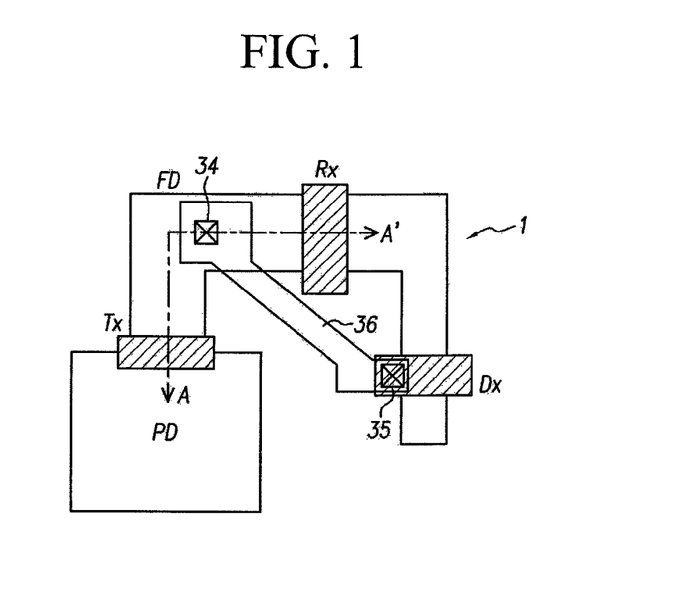
FIGS. 1 and 2 illustrate a CMOS image sensor.
Example

As illustrated in example FIG. 1, a 4T-type CMOS image sensor may include photodiode region PD formed on and/or over a widest portion of active region 1 and transfer transistor Tx, reset transistor Rx and drive transistor Dx overlapped with a portion of active region 1 except photodiode region PD.

Figure 2:
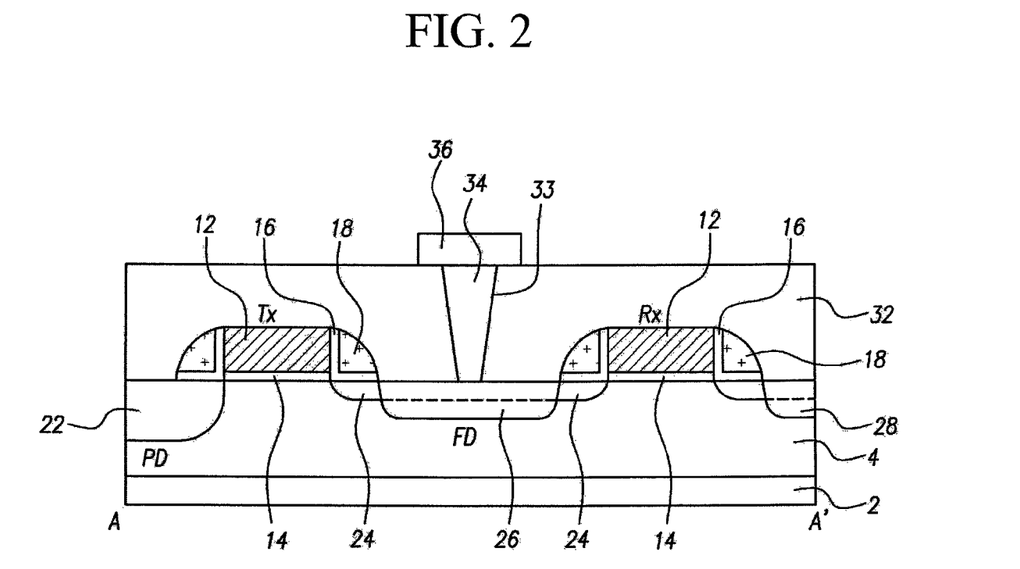

As illustrated in example FIG. 2, CMOS image sensor may include epitaxial layer 4 formed on and/or over semiconductor substrate 2 divided into active region 1 and device isolation region. Semiconductor substrate 2 may be a p++ type substrate and epitaxial layer 4 may be a p– type.

The CMOS image sensor may further include device isolation layer formed in the device isolation region of semiconductor substrate 2, gate electrode 12, gate oxide layer 16, gate spacers 18, n– diffusion region 22, LDD region 24, source/drain regions 26, 28, insulating interlayer 32, first contact hole 33, second contact hole 35, first contact plug 34 formed in the first contact hole 33, and a second contact plug formed in second contact hole 35, and metal line 36.

Gate electrode 12 for transfer transistor Tx and reset transistor Rx may be formed on and/or over epitaxial layer 4 including gate insulating layer 14. Gate oxide layer 16 and gate spacer 18 may be formed on both sidewalls of gate electrode 12 and gate insulating layer 14. n– diffusion region 22 may be formed in epitaxial layer 4 of photodiode region PD. LDD region 24 may be formed in active region 1 between transistors Tx, Rx, and Dx. Source/drain region 26, 28 may be formed on and/or over LDD region 26 next to both sides of gate spacer 18. Insulating interlayer 32 may be formed on and/or over epitaxial layer 4 to cover gate electrode 12 including gate spacer 18.

First contact hole 33 may be formed in insulating interlayer 32 to expose source region 26. The second contact hole may be formed on and/or over a gate electrode of drive transistor Dx. First contact plug 34 and the second contact plug may be formed in first contact hole 33 and second contact hole 35 of insulating interlayer 32, respectively. Metal line 36 may be formed on and/or over one of first contact plug 34 and the second plug to electrically connect source region 26 and the gate electrode of drive transistor Dx.

In operation, photodiode PD may sense incident light and then generates charges according to light intensity variation. Transfer transistor Tx may transfer the charges generated by photodiode PD to floating diffusion region FD. Before the transfer, floating diffusion region FD transports electrons from photodiode PD to reset transistor Rx to turn on. Thus, floating diffusion region FD may be set having a low charge state at a predetermined level. Reset transistor Rx may discharge charges stored in floating diffusion region FD for signal detection and drive transistor Dx may serve as a source follower for converting the charges to a voltage signal.

In the above-configured CMOS image sensor, if the charges generated from photodiode region PD are transferred to floating diffusion region FD, reset transistor Rx is turned on. Thus, the charges are sent to drive transistor Dx and then converted to a voltage signal. Floating diffusion region FD may function as a capacitor. Moreover, a junction cap may form between source/drain regions 26, 28 heavily implanted with n+ impurity ions and the p– type epitaxial layer 4. The junction cap mainly controls capacitance with doping concentration. Yet, may be a problem as causing low capacitance. Specifically, floating diffusion region FD may receive electrons from photodiode region PD and then convert the electrons to a voltage. If low capacitance occurs, noise sensitively may become a problem.

SUMMARY

Embodiments relate to a CMOS image sensor and fabricating method thereof having increased capacitance in a floating diffusion region.

Embodiments relate to a CMOS image sensor that can include at least one of the following: an epitaxial layer formed over a semiconductor substrate; a device isolation layer formed in the epitaxial layer defining an active area including a photodiode region and a transistor region, and a device isolation region; a gate insulating layer formed over the epitaxial layer of the transistor region; a gate electrode formed over the epitaxial layer of the transistor region including the gate insulating layer; a gate spacer formed on both sidewalls of the gate electrode and the gate insulating layer; n+ type source and drain regions formed in the epitaxial layer adjacent both sides of the gate spacer; at least one n+ type island region formed in the epitaxial layer adjacent the photodiode region; an insulating interlayer formed over the epitaxial layer including the gate electrode and the gate spacer; a first contact hole extending through the insulating interlayer exposing the source region; a second contact hole extending through the insulating interlayer exposing the at least one island region; a first contact plug formed in the first contact hole and connected to the source region; a second contact plug formed in the second contact hole and connected to the at least one island region; a metal line formed over the first contact plug and the second contact plug to electrically connect the source region to the at least one island region.

Embodiments relate to a CMOS image sensor that can include at least one of the following: an epitaxial layer formed over a semiconductor substrate; a gate electrode formed over the epitaxial layer; a gate metal formed over a floating diffusion region of the epitaxial layer; n+ type source and drain regions formed in the epitaxial layer; a gate spacer formed on both sidewalls of the gate electrode and both sidewalls of the gate metal; an insulating interlayer formed over the epitaxial layer including the gate electrode, the gate spacer and the gate metal layer, wherein the insulating interlayer includes a first contact hole extending through the insulating interlayer exposing the source region; a second contact hole extending through the insulating interlayer exposing the gate metal; a first contact plug formed in the first contact hole and connected to the source region; a second contact plug formed in the second contact hole and connected to the gate metal; a metal line formed over the first contact plug and the second contact plug to electrically connect the source region to the gate metal.

Embodiments relate to a method of fabricating a CMOS image sensor that can include at least one of the following steps: forming an epitaxial layer over a semiconductor substrate; forming a device isolation layer in the epitaxial layer defining an active area including a photodiode region, a floating diffusion region and a transistor region and a device isolation area; forming a source region and a drain region in the epitaxial layer adjacent both sides of the MOS gate pattern; forming a MOS gate pattern over the floating diffusion region of the epitaxial layer, wherein the source region and the drain region are provided on both sides of the MOS gate pattern; forming an insulating interlayer over the epitaxial layer including the MOS gate pattern; exposing the source region and the gate metal; and then electrically connecting the source region to the MOS gate pattern.

DRAWINGS

Example
FIGS. 2 to 8 illustrate a CMOS image sensor, in accordance with embodiments.

DESCRIPTION

Figure 3:
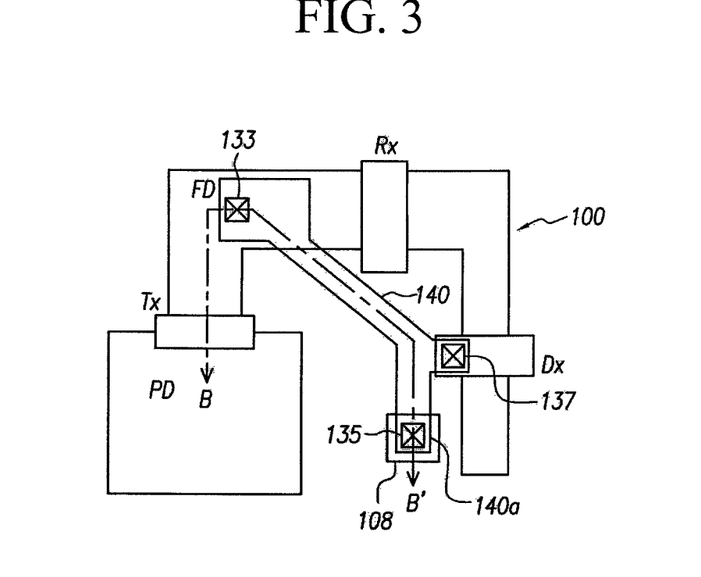

As illustrated in example FIG. 3, a CMOS image sensor in accordance with embodiments can include photodiode region PD formed in a widest portion of active region 100. Island-type active region 108 can be formed adjacent to photodiode region PD. A junction capacitor of active region 108 can be formed parallel to source region 126. Transfer transistor Tx, reset transistor Rx and drive transistor Dx can overlap a portion of active region 100 except photodiode region PD. Island region 108 can be formed in other locations other than adjacent to photodiode PD. Island region 108 can also include at least one or more island regions 108.

Figure 4:
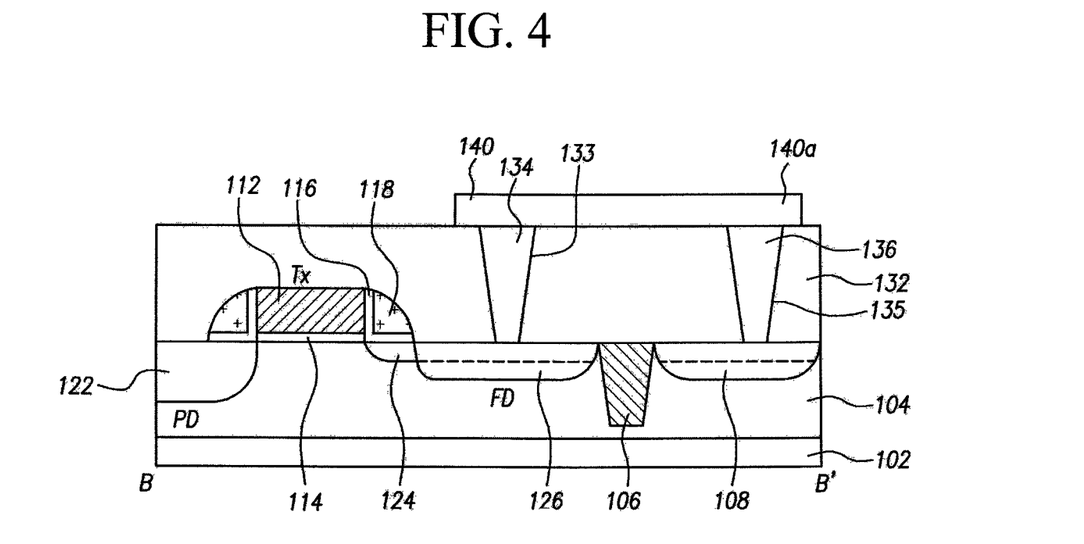

As illustrated in example FIG. 4, the CMOS image sensor in accordance with embodiments can further include p++ semiconductor substrate 102, p− epitaxial layer 104, device isolation layer 106, gate electrode 112, gate oxide layer 116, gate spacer 118, n− type diffusion region 122, LDD region 124, source region 126, drain region, island-type active region 108, insulating interlayer 132, first contact hole 133, second contact hole 135, third contact hole 137, first contact plug 134, second contact plug 136 and metal line 140. Metal line 140 can include protruding electrode 140a electrically connected to second contact plug 136 of island-type active region 108.

Particularly, p− epitaxial layer 104 can be formed on and/or over p++ type semiconductor substrate 102 divided into active region 100 and a device isolation region. Device isolation layer 106 can be formed in the device isolation region of semiconductor substrate 102. Gate insulating layer 114 can be formed on and/or over epitaxial layer 104 and gate electrode 112 of transfer transistor Tx can be formed on and/or over gate insulating layer 114. Gate oxide layer 116 and gate spacer 118 can be formed on both sidewalls of gate electrode 112.

Moreover, n− diffusion region 122 can be formed in epitaxial layer 104 of photodiode region PD. LDD region 124 can be formed adjacent both sides of the gate electrodes of transistors Tx, Rx, and Dx and epitaxial layer 104 of island-type active region 108. The drain region, source region 126 and island region 108 can be formed in LDD region 124 of the transistor.

Insulating interlayer 132 can be formed on and/or over epitaxial layer 104 to cover electrode 112 including gate spacer 118. First contact hole 133 can extend through insulating interlayer 132 to expose an uppermost surface of source region 126. Second contact hole 135 can extend through insulating interlayer 132 to expose the uppermost surface of island region 108. Third contact hole 137 can extend through insulating interlayer 132 to expose the uppermost surface of the gate electrode of drive transistor Dx. First contact plug 134 and second contact plug 136 can be formed in first contact hole 133 and second contact hole 135, respectively. Metal line 140 can then be formed on and/or over first contact plug 134 and second contact plug 136 to electrically connect source region 126, island region 108 and the gate electrode of drive transistor Dx.

In operation, photodiode PD senses incident light and then generates charges according to light intensity variation. Transfer transistor Tx may then transfer the charges generated by photodiode PD to floating diffusion region FD. Before the transfer, floating diffusion region FD can transport electrons from photodiode PD to reset transistor Rx to turn on. Accordingly, floating diffusion region FD can be set to a low charge state at a predetermined level. Reset transistor Rx can discharge charges stored in floating diffusion region FD for signal detection while drive transistor Dx can serve as a source follower for converting the charges to a voltage signal.

Figure 5A:
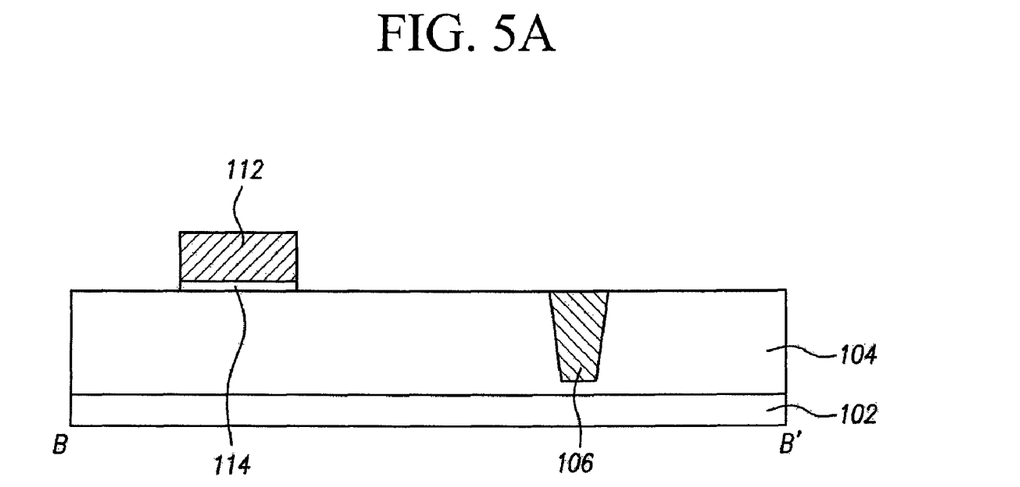

As illustrated in example FIG. 5A, a method of fabricating a CMOS image sensor illustrated in example FIGS. 3 and 4 can include forming lightly doped p− epitaxial layer 104 on and/or over heavily doped p++ semiconductor substrate 102 by an epitaxial process. Epitaxial layer 104 can have a large and deep depletion region of photodiode PD in order to increase the ability of low voltage photodiode PD to collect photogenerated charges and to further enhance photosensitivity. Semiconductor substrate 102 can be divided into active region 100 and a device isolation region. Device isolation layer 106 can be formed in the device isolation region by shallow trench isolation (STI) or local oxidation of silicon (LOCOS).

Gate insulating layer 114 and gate electrode 112 can then be formed on and/or over epitaxial layer 104 provided with device isolation layer 106. In particular, a gate insulating layer and a gate metal layer can be sequentially stacked on and/or over epitaxial layer 104 and then patterned by a photolithographic process using a mask to form gate insulating layer 114 and gate electrode 112.

Figure 5B:
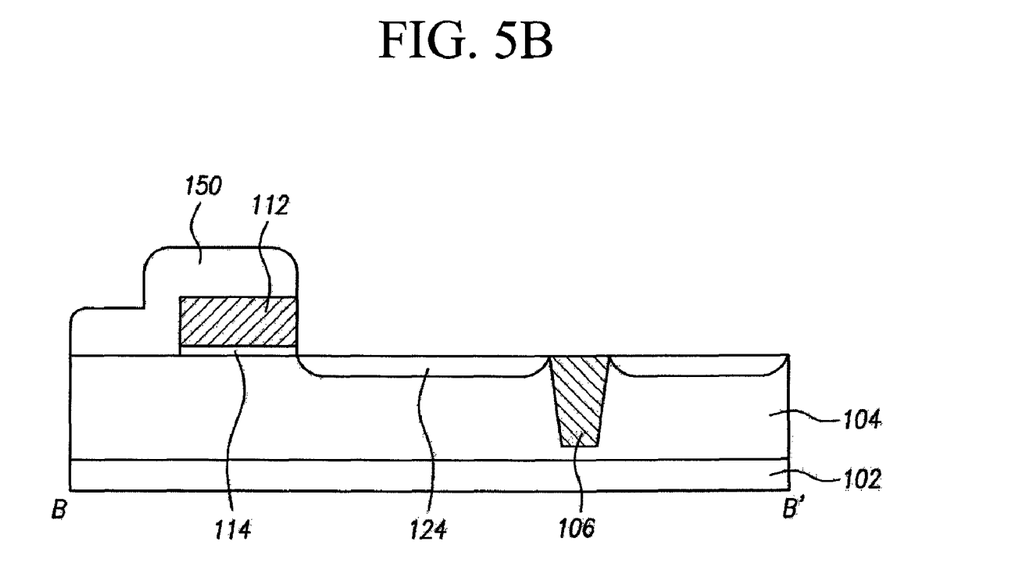

As illustrated in example FIG. 5B, LDD region 124 can then be formed in epitaxial layer 104 adjacent to both sides of gate electrode 112 of each of transistors Tx, Rx and Dx and in the epitaxial layer of island region 108. In particular, first photoresist pattern 150 can be formed to expose source and drain regions adjacent to both sides of gate electrode 112 of each of transistors Tx, Rx and Dx and island region 108. Subsequently, n− impurity ions can then be lightly implanted into the exposed source and drain regions and the exposed island region 108 using first photoresist pattern 150 as a mask to form LDD region 124. First photoresist pattern 150 can then be removed by stripping.

Figure 5C:
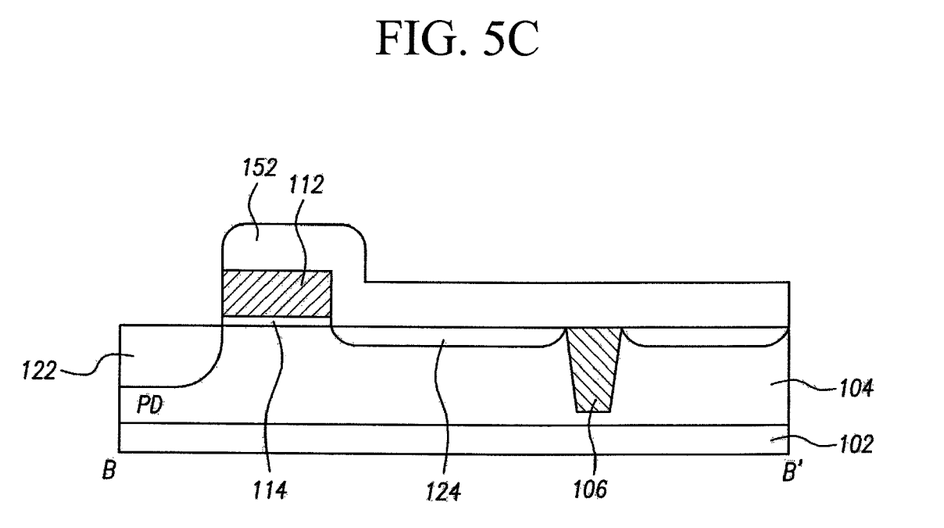

As illustrated in example FIG. 5C, n− diffusion region 122 can then be formed on and/or over epitaxial layer 104 of photodiode region PD. In particular, second photoresist pattern 152 can be formed to expose photodiode region PD. n− diffusion region 122 can then be formed by lightly implanting n− type impurity ions into epitaxial layer 104 using second photoresist pattern 152 as a mask. The process for implanting such impurity ions for forming n− diffusion region 122 can be carried out with energy higher than that of LDD region 124 in order to form n− diffusion region 122 deeper than LDD region 124. Second photoresist pattern 152 can then be removed by stripping.

Figure 5D:
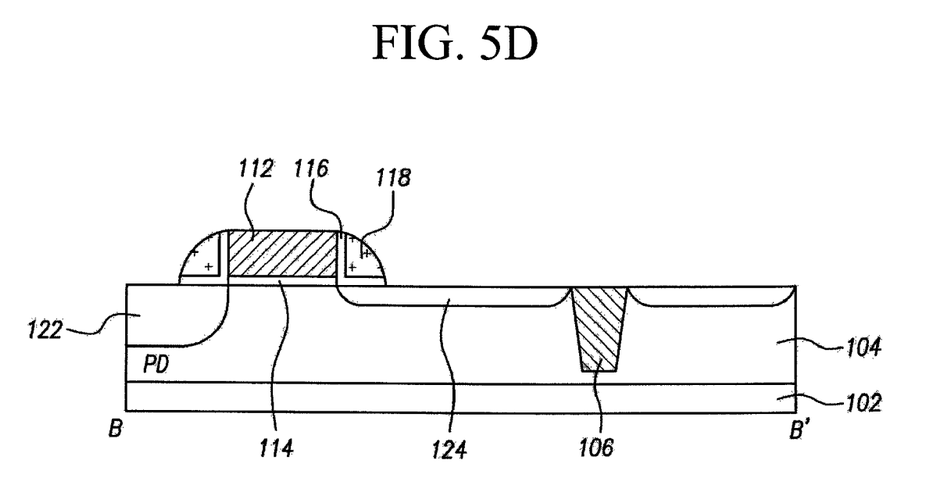

As illustrated in example FIG. 5D, gate oxide layer 116 and gate spacer 118 can then be formed on sidewalls of gate electrode 112. In particular, the gate oxide layer can be patterned to form gate oxide layer 116 by photolithographic with dry etching after being formed on and/or over the entire uppermost surface of epitaxial layer 104 including gate electrode 112. Gate oxide layer 116 provided on and/or over gate electrode 112 can then be removed by dry etching to expose a uppermost surface of gate electrode 112. After an insulating layer has been formed on and/or over gate electrode 112 including gate oxide layer 116, gate spacer 118 can then be formed on both sidewalls of gate electrode 112 by etchback.

Figure 5E:
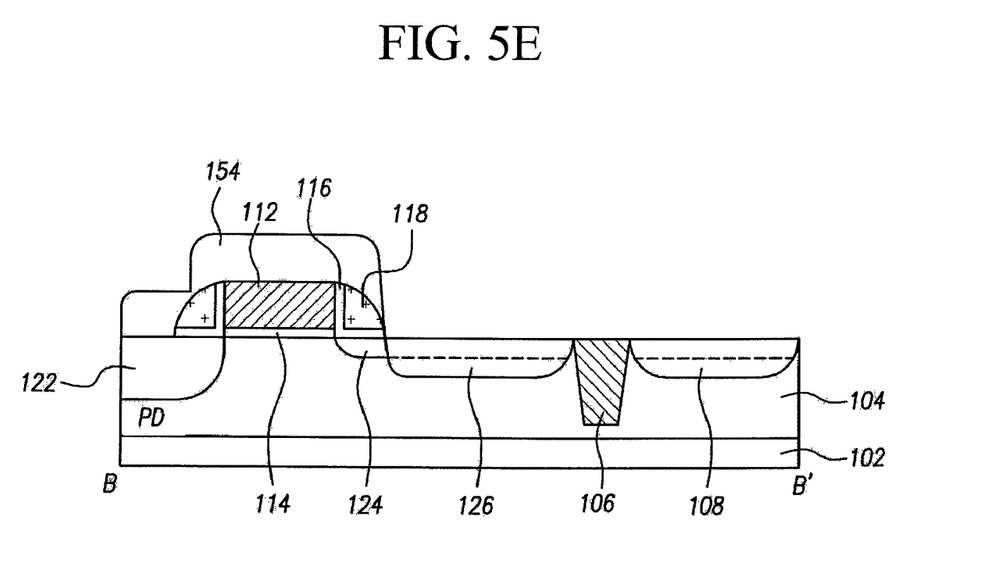

As illustrated in example FIG. 5E, third photoresist pattern 154 can then be formed to expose source and drain regions of the respective transistors. Source region 126, a drain region and island region 108 can be formed by heavily implanting n+ impurity ions into the exposed source and drain regions using third photoresist pattern 154. Third photoresist pattern 154 can then be removed by stripping.

Figure 5F:
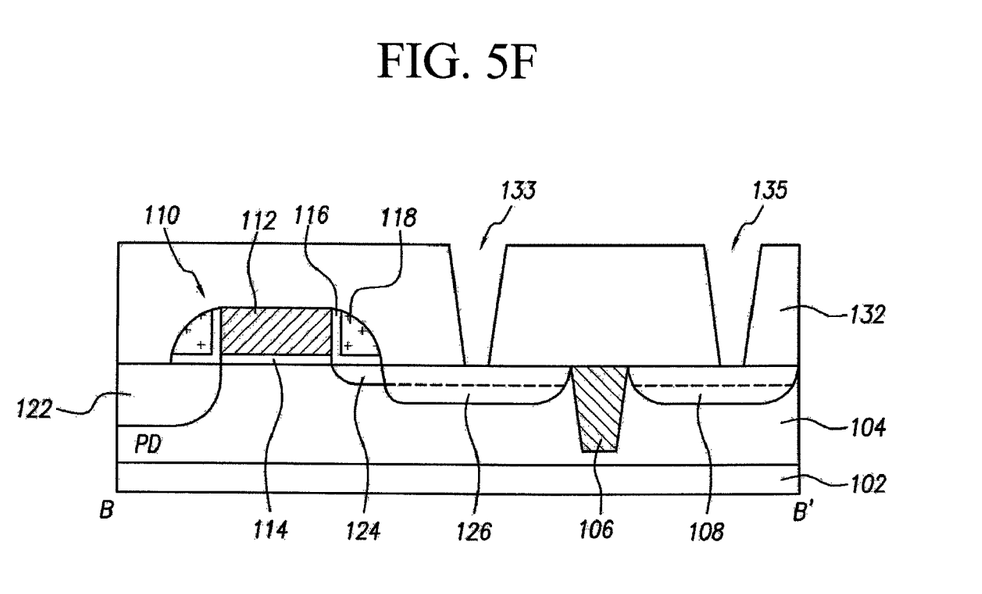

As illustrated in example FIG. 5F, insulating layer 132 having first contact hole 133 and second contact hole 135 can then be formed on and/or over epitaxial layer 104 including gate electrode 112, source region 126 and island region 108. In particular, an insulating interlayer can be deposited on and/or over the uppermost surface of epitaxial layer 104, and then patterned by photolithography using a mask to form first contact hole 133 exposing source region 126 and second contact hole 135 exposing island region 108. Simultaneously, a third contact hole can also be formed to expose an uppermost surface of drive transistor Dx.

Figure 5G:
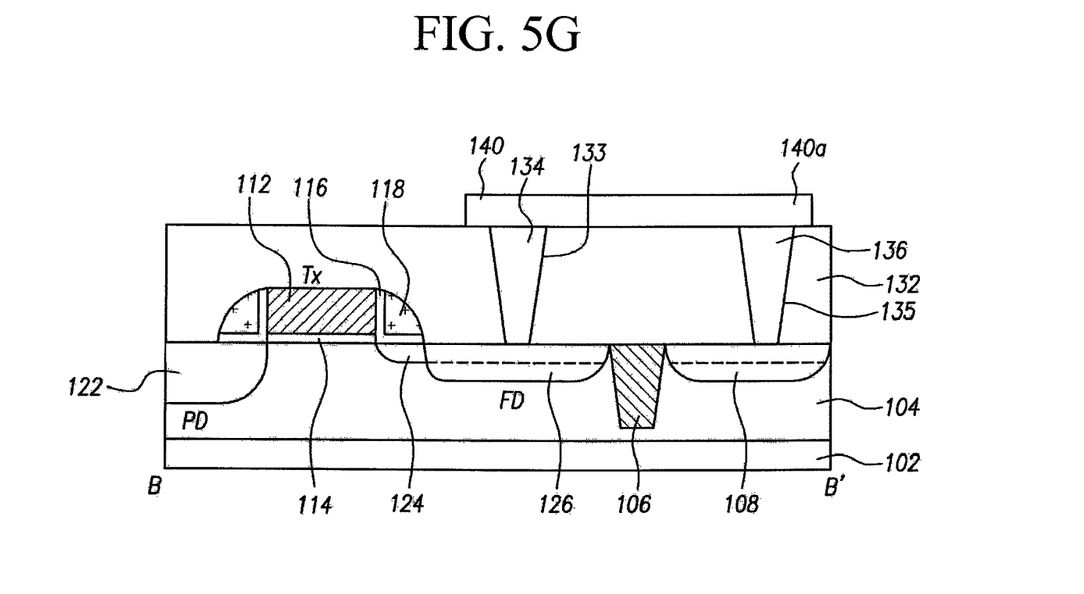

As illustrated in example FIG. 5G, first contact plug 134 can be formed in first contact hole 133 and second contact plug 136 can be formed in second contact holes 135. Simultaneously, a third contact plug can also be formed in the third contact hole of drive transistor Dx. Metal line 140 can then be formed on and/or over first contact plug 134 and second contact plug 136 to establish an electrical connection to source region 126 and island region 108. Metal line 140 can also be formed on and/or over the third plug to electrically connect drive transistor Dx.

As mentioned in the foregoing description, island region 108 can be formed adjacent photodiode region PD. By way of by second contact plug 136, island region 108 can be electrically connected to metal line 140 extending from floating diffusion region FD. Since island region 108 can be heavily doped with the n+ impurity ions, junction cap is generated between the n+ impurity ions of island region 108 and p− epitaxial layer 104. Thus, the CMOS image sensor in accordance with embodiments can have enhanced capacitance by having a capacitor of island region 108 electrically connected parallel to a capacitor of floating diffusion region FD. Due to the increased capacitance, noise generation is reduced. Moreover, an acceptable quantity of charges from photodiode PD can be increased to raise a saturation level.

Figure 6:
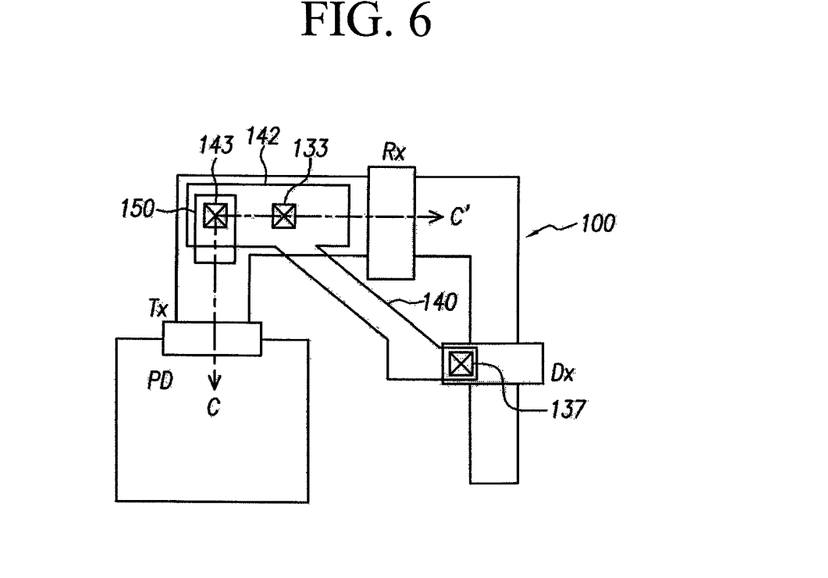
Figure 7:
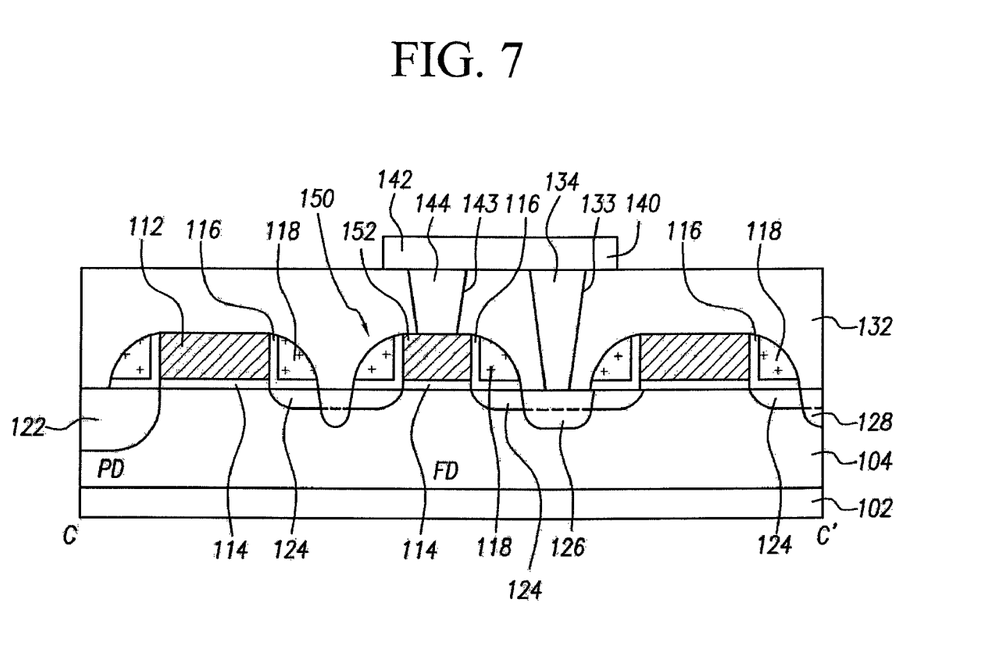

As illustrated in example FIGS. 6 and 7, a CMOS image sensor in accordance with embodiments can be provided with a MOS capacitor parallel with a junction capacitor of floating diffusion region FD to form MOS-type gate pattern 150 on and/or over floating diffusion region FD. In particular, the CMOS image sensor in accordance with embodiments can include semiconductor substrate 102, epitaxial layer 104, gate electrodes 112 of transfer transistor Tx and reset transistor Rx, gate metal 152 for MOS-type gate pattern 150, LDD region 124, gate oxide layer 116, gate spacer 118, insulating interlayer 132, first contact plug 134 in first contact hole 133, second contact plug 136 in the second contact hole 135, and metal line 140. Metal line 140 can include protruding electrode 142 electrically connected to gate metal 152 of MOS-type gate pattern 150. Thus, metal line 140 can be configured to be electrically connected to gate metal 152 of MOS type gate pattern 150.

Gate electrode 112 transfer transistor Tx and reset transistor Rx can be formed on and/or over epitaxial layer 104 including gate insulating layer 114. Gate metal 152 of MOS-type gate pattern 150 can then be formed on and/or over epitaxial layer 104 including gate insulating layer 114. LDD region 124 can then be provided in epitaxial layer 104 adjacent both sides of gate electrode 112 and adjacent both sides of gate metal 152. Gate oxide layer 116 and gate spacer 118 can then be provided on both sidewalls of gate electrode 112 and both sides of gate metal 152.

Insulating interlayer 132 can then be formed on and/or over epitaxial layer 104 to cover gate electrode 112 including gate spacer 118 and also cover gate metal 152. First contact hole 133 extending through insulating interlayer 132 can be formed to expose source region 126. Second contact hole 143 extending through insulating interlayer 132 can be formed to expose gate metal 152. First contact plug 134 and second contact plug 144 can then be formed in first contact hole 133 and second contact hole 143. Metal line 140 can be formed on and/or over first contact plug 134 and second contact plug 144 to electrically connect source region 126 and gate metal 152. Metal line 140 can include protruding electrode 142 electrically connected to gate metal 152 of MOS-type gate pattern 150. Namely, metal line 140 can be configured to protrude for electric connection to gate metal 152 of MOS-type gate pattern 150.

Figure 8A:
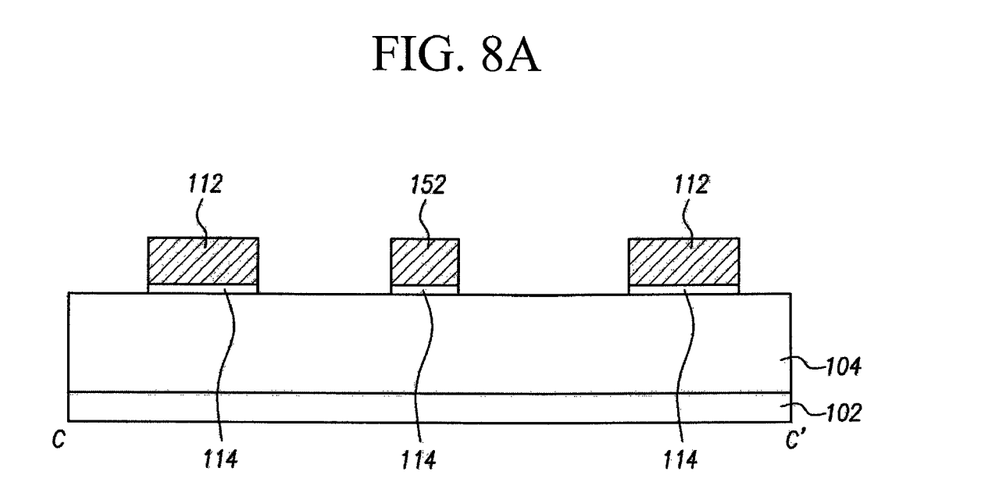

As illustrated in example FIG. 8A, a method of fabricating the CMOS image sensor illustrated in example FIG. 7 can include lightly-doped p− epitaxial layer 104 formed on and/or over heavily doped p++ semiconductor substrate 102 by an epitaxy process.

Gate electrodes 112 of transistors Tx, Rx and Dx, gate metal 152 of MOS-type gate pattern 150, and gate insulating layer 154 can then be formed on and/or over epitaxial layer 104. In particular, a gate insulating layer and a gate metal layer can be sequentially deposited on and/or over epitaxial layer 104 by deposition. The gate insulating layer and the gate metal layer can then be patterned by photolithographic processing using a mask to form gate insulating layer 114, gate electrodes 112 and gate metal 152.

Figure 8B:
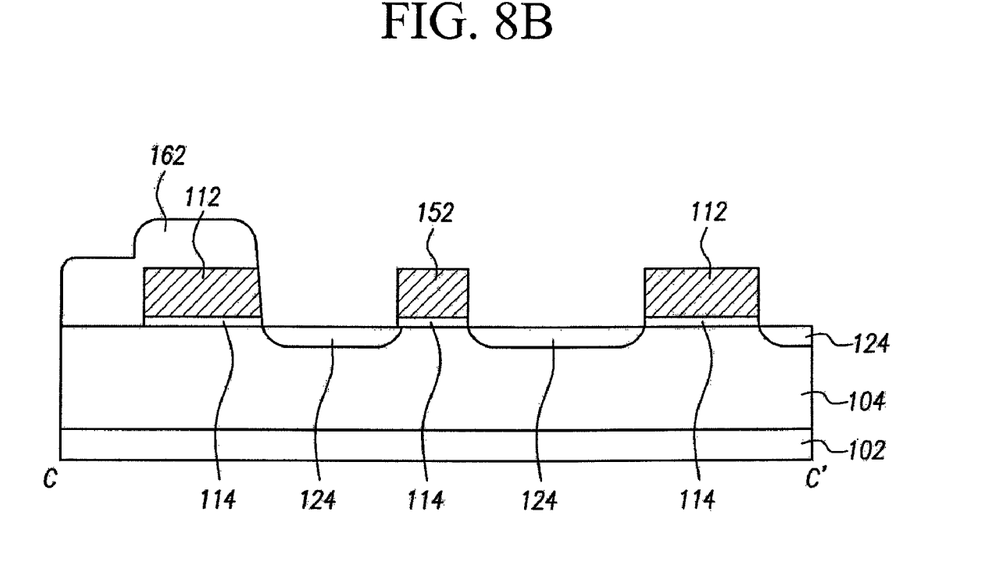

As illustrated in example FIG. 8B, LDD region 124 can then be formed in epitaxial layer 104 adjacent to both sides of gate electrode 112 and adjacent both sides of gate metal 152. In particular, first photoresist pattern 162 can be formed to expose source and drain regions adjacent to both sides of gate electrode 112 of each transistors Tx, Rx and Dx. An implantation process for lightly implanting n− impurity ions into the exposed source and drain regions using gate electrodes 112 and gate metal 152 as masks and using first photoresist pattern 162 to form LDD region 124. First photoresist pattern 162 can then be removed by stripping.

Figure 8C:
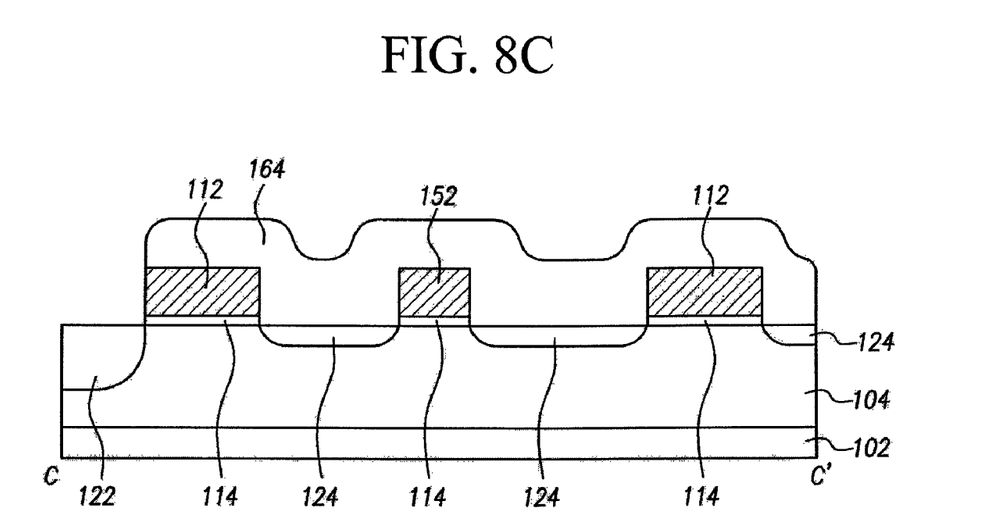

As illustrated in example FIG. 8C, n− diffusion region 122 can then be formed on and/or over epitaxial layer 104 of photodiode region PD. In particular, second photoresist pattern 164 can be formed exposing photodiode region PD. Formation of n− diffusion region 122 can occur by lightly implanting n− impurity ions into epitaxial layer 104 of photodiode region PD using second photoresist pattern 164. Second photoresist pattern 164 can then be removed by stripping.

Figure 8D:
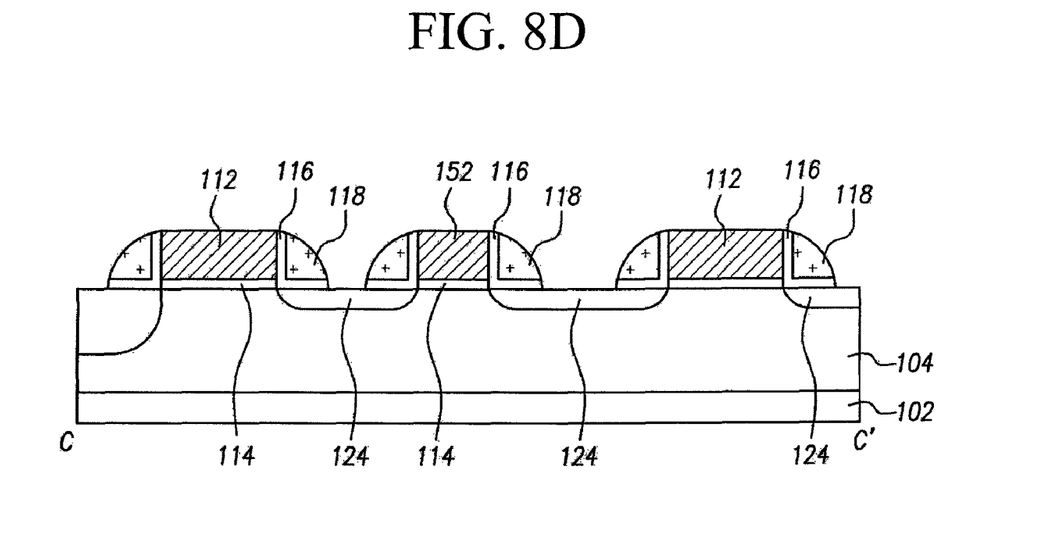

As illustrated in example FIG. 8D, gate oxide layer 116 and gate spacer 118 can then be formed on sidewalls of gate electrode 112 and gate metal 152. In particular, after forming a gate oxide layer on and/or over epitaxial layer 104 including gate electrode 112 and gate metal 152, the gate oxide layer can then be patterned to form gate oxide layer 116 by photolithographic processing with dry etching. Gate oxide layer 116 on and/or over gate electrode 112 and gate metal 152 can then be removed by dry etching to expose the uppermost surface of gate electrode 112 and gate metal 152, respectively. After an insulating layer has been formed on and/or over gate electrode 112 and gate metal 152 including gate oxide layer 116, gate spacers 118 can then be formed on both sidewalls of gate electrode 112 and gate metal 152 by etchback.

Figure 8E:
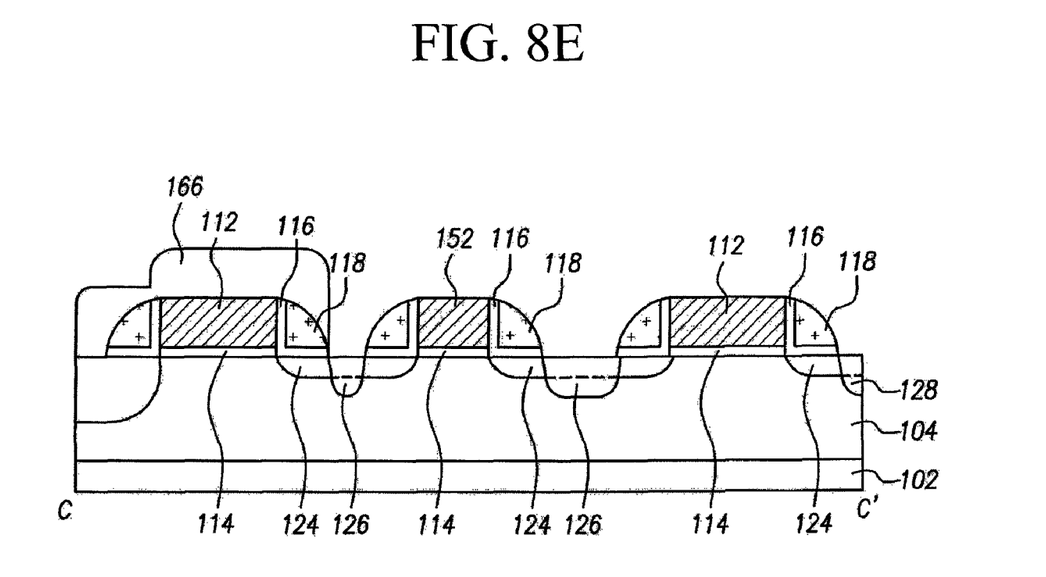

As illustrated in example FIG. 8E, third photoresist pattern 166 can then be formed to expose source and drain regions of the respective transistors. Source region 126 and drain region 128 can be formed by heavily implanting n+ impurity ions into the exposed source and drain regions using third photoresist pattern 166. Third photoresist pattern 166 can then be removed by stripping.

Figure 8F:
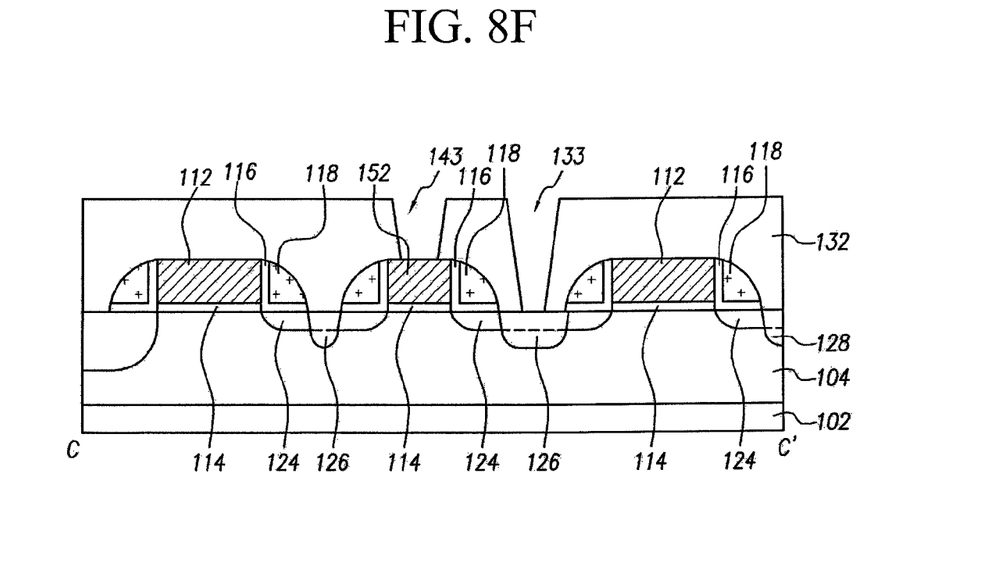

As illustrated in example FIG. 8F, insulating layer 132 having first contact hole 133 and second contact hole 143 can then be formed. In particular, after insulating interlayer 132 has been deposited on and/or over whole epitaxial layer 104, it can be patterned by photolithography using a mask to form first contact hole 133 exposing source region 126 and second contact hole 143 exposing gate metal 152. Simultaneously, a third contact hole can be formed on and/or over drive transistor Dx.

Figure 8G:
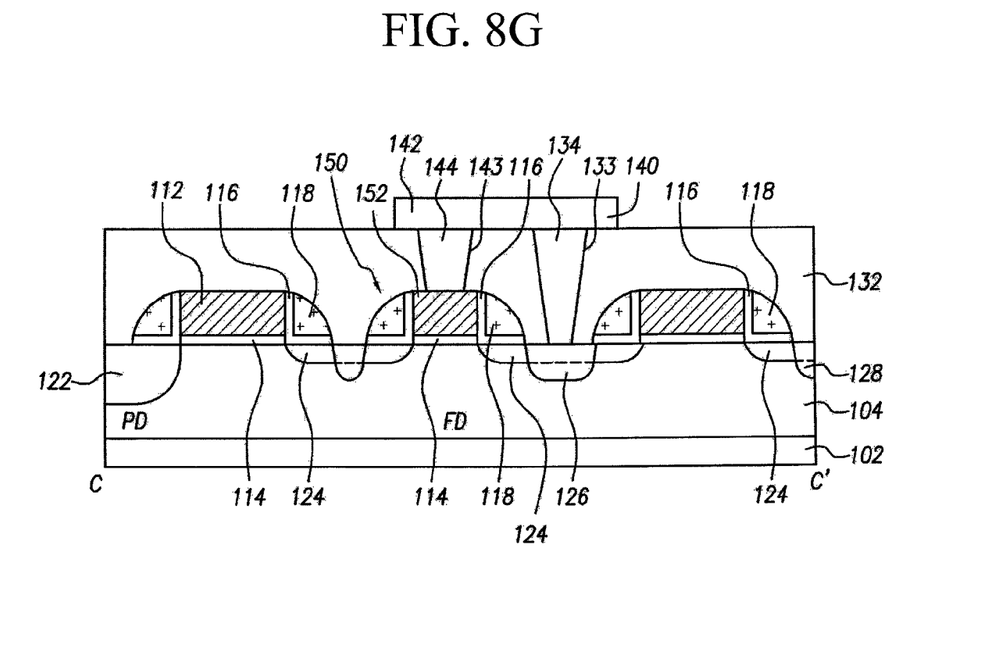

As illustrated in example FIG. 8G, first contact plug 134 and second contact plug 144 can then be formed in first contact hole 33 and second contact hole 143, respectively. Metal line 140 can then be formed on and/or over first contact plug 134 and second contact plug 144 to electrically connect source region 126, gate metal 152 and gate electrode of drive transistor Dx.

As mentioned in the foregoing description, MOS-type gate pattern 150 can be formed on and/or over floating diffusion region FD, i.e., on and/or over source region 124, to form an MOS capacitor. Thus, the CMOS image sensor in accordance with embodiments can have increased capacitance due to the capacitance of MOS-type gate pattern 150 and the capacitance of the n+ junction capacitor of floating diffusion region FD. Due to an increase in capacitance, noise generation is reduced. Moreover, an acceptable quantity of charges from photodiode PD can be increased to raise a saturation level. Since the MOS capacitor can have a capacitance greater than that of the junction capacitor, capacitance can be effectively increased.

The CMOS image sensor in accordance with embodiments can be advantageous by having an island region heavily doped with n+ impurity ions to form an n+ junction capacitor between the n+ impurity ions and an p− epitaxial layer. Secondly, an MOS-type gate pattern can be formed in floating diffusion region FD to configure a MOS capacitor. Moreover, the use of an n+ junction capacitor and a MOS capacitor can serve to increase overall capacitance, which in turn, can reduce noise generation and increase an acceptable quantity of charges from a photodiode to raise a saturation level.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   an epitaxial layer formed over a semiconductor substrate;
   a device isolation layer formed in the epitaxial layer defining an active area including a photodiode region and a transistor region, and a device isolation region;
   a gate insulating layer formed over the epitaxial layer of the transistor region;
   a gate electrode formed over the epitaxial layer of the transistor region including the gate insulating layer;
   a gate spacer formed on both sidewalls of the gate electrode and the gate insulating layer;
   n+ type source and drain regions formed in the epitaxial layer adjacent both sides of the gate spacer;
   at least one n+ type island region formed in the epitaxial layer adjacent the photodiode region and separated from the n+ type source region by the device isolation layer;
   an insulating interlayer formed over the epitaxial layer including the gate electrode and the gate spacer;
   a first contact hole extending through the insulating interlayer exposing the n+ type source region;
   a second contact hole extending through the insulating interlayer exposing the at least one island region;
   a first contact plug formed in the first contact hole and connected to the n+ type source region;
   a second contact plug formed in the second contact hole and connected to the at least one island region;
   a metal line formed over the first contact plug and the second contact plug to electrically connect the n+ type source region to the at least one island region; and
   an electrode protruding from the metal line and electrically connected to the second contact plug.

2. The apparatus of claim 1, further comprising an LDD region formed over the epitaxial layer adjacent to both sides of the gate electrode.

3. The apparatus of claim 2, further comprising a gate oxide layer formed between the gate electrode and the gate spacer.

4. The apparatus of claim 3, further comprising an n−diffusion region formed in the epitaxial layer of the photodiode region.

5. An apparatus comprising:
   an epitaxial layer formed over a semiconductor substrate;
   at least one transistor formed over the epitaxial layer, wherein the at least one transistor includes a gate electrode and gate electrode spacers formed on both sidewalls of the gate electrode;
   a gate pattern formed over a floating diffusion region of the epitaxial layer, wherein the gate pattern includes a gate metal and gate metal spacers formed on both sidewalls of the gate metal;
   n+ type source and drain regions formed in the epitaxial layer and adjacent to the at least one transistor and the gate pattern, wherein the gate pattern is coupled to the at least one transistor through the n+ type source region;

an insulating interlayer formed over the epitaxial layer including the at least one transistor and the gate pattern, wherein the insulating interlayer includes a first contact hole extending through the insulating interlayer exposing the n+ type source region; and a second contact hole extending through the insulating interlayer exposing the gate metal;

a first contact plug formed in the first contact hole and connected to the n+ type source region;

a second contact plug formed in the second contact hole and connected to the gate metal; and a metal line formed over the first contact plug and the second contact plug to electrically connect the n+ type source region to the gate metal.

6. The apparatus of claim 5, further comprising an electrode protruding from the metal line and electrically connected to the gate metal.

7. The apparatus of claim 5, further comprising a device isolation layer formed in the epitaxial layer defining an active region including a photodiode region and a transistor region, and a device isolation region.

8. The apparatus of claim 7, further comprising an LDD region formed over the epitaxial layer adjacent to both sides of the gate electrode and both sides of the gate metal.

9. The apparatus of claim 8, further comprising a gate oxide layer formed between the gate electrode and the gate electrode spacers and also between the gate metal and the gate metal spacers.

10. The apparatus of claim 9, further comprising an n− diffusion region formed in the epitaxial layer of the photodiode region.

* * * * *